US006190973B1

(12) United States Patent
Berg et al.

(10) Patent No.: US 6,190,973 B1
(45) Date of Patent: Feb. 20, 2001

(54) METHOD OF FABRICATING A HIGH QUALITY THIN OXIDE

(75) Inventors: John E. Berg, Sunnyvale, CA (US); Bernice L. Kickel; John A. Smythe, III, both of Boise, ID (US)

(73) Assignee: Zilog Inc., Campbell, CA (US)

( * ) Notice: Under 35 U.S.C. 154(b), the term of this patent shall be extended for 0 days.

(21) Appl. No.: 09/215,797

(22) Filed: Dec. 18, 1998

(51) Int. Cl.[7] ................................................ H01L 21/8234
(52) U.S. Cl. .......................... 438/275; 438/263; 438/264
(58) Field of Search .................... 438/275, 263, 438/264

(56) References Cited

U.S. PATENT DOCUMENTS

| 4,139,658 | * | 2/1979 | Cohen et al. . |
| 4,855,800 | * | 8/1989 | Esquivel et al. . |
| 5,258,333 | | 11/1993 | Shappir et al. . |
| 5,296,411 | | 3/1994 | Gardner et al. . |
| 5,512,519 | | 4/1996 | Hwang . |
| 5,538,923 | | 7/1996 | Gardner et al. . |
| 5,591,681 | | 1/1997 | Wristers et al. . |

OTHER PUBLICATIONS

Fukuda H. et al., "Novel $N_2O$–Oxynitridation Technology for Forming Highly Reliable EEPROM Tunnel Oxide Films," *IEEE Electron Device Letters*, vol. 12, No. 11 (Nov. 1991) pps. 587–589.

Wu A.T. et al., "Nitridation–Induced Surface Donor Layer in Silicon," *Applied Physics Letters*, vol. 55, No. 16 (Oct. 1989) pps. 1665–1667.

* cited by examiner

*Primary Examiner*—Long Pham
(74) *Attorney, Agent, or Firm*—Skjerven Morrill MacPherson LLP

(57) ABSTRACT

The present invention provides a method of forming a high quality thin oxide on a semiconductor body. A sacrificial oxide is formed on the semiconductor and then etched to eliminate the surface contamination of the semiconductor body. Then, an EEPROM oxide is formed following by an arsenic implant. Next the EEPROM oxide on the semiconductor body is then prepared by thin oxide growth. The thin oxide is preferably formed in a steam ambient. Subsequently, the oxide is annealed under nitrous oxide ambient using a combination of in-situ and RTP annealing process.

28 Claims, 3 Drawing Sheets

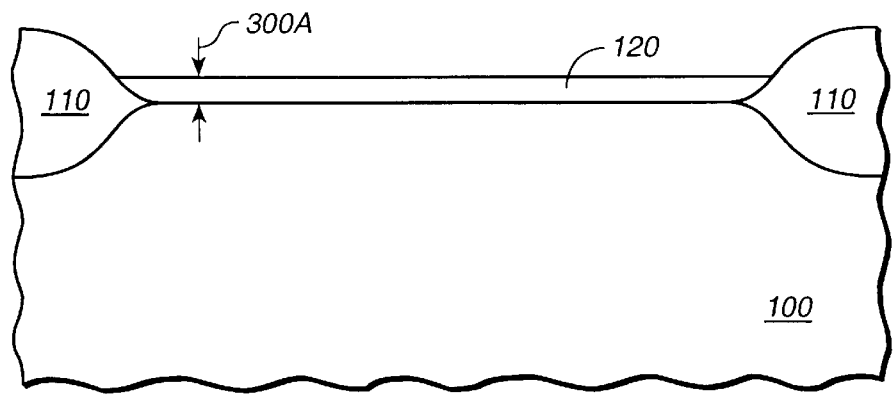
FIG._1
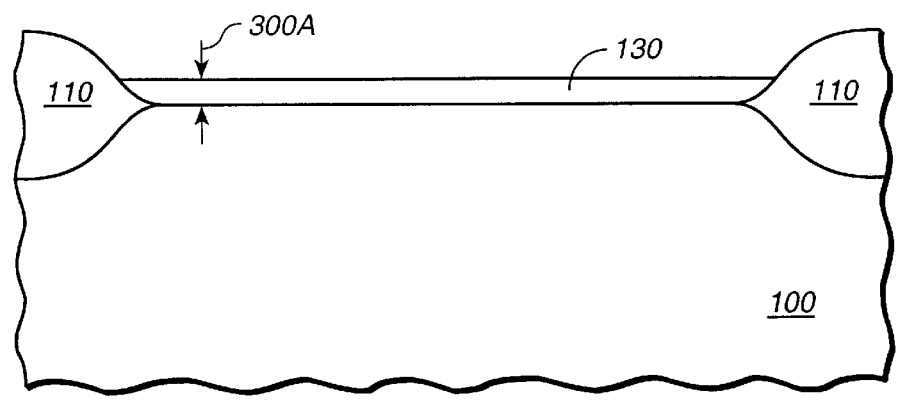
FIG._2
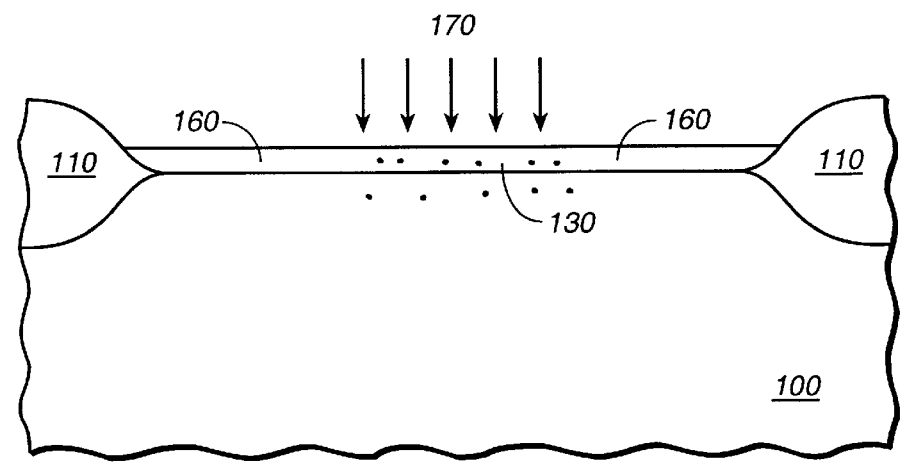
FIG._3

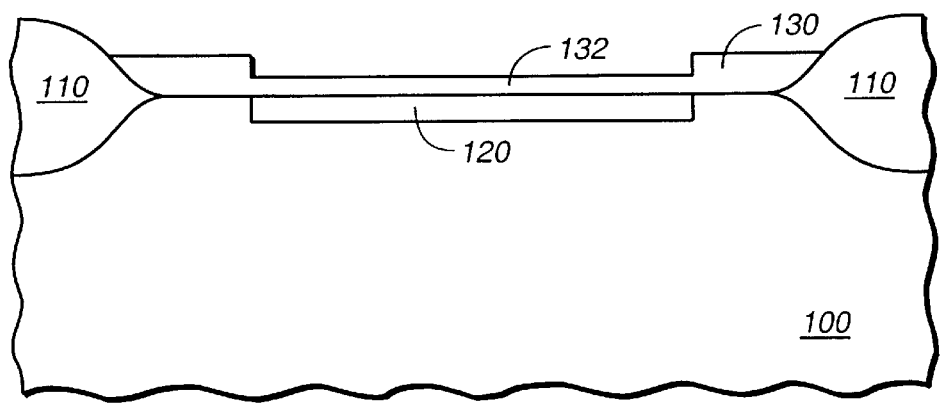
FIG._4
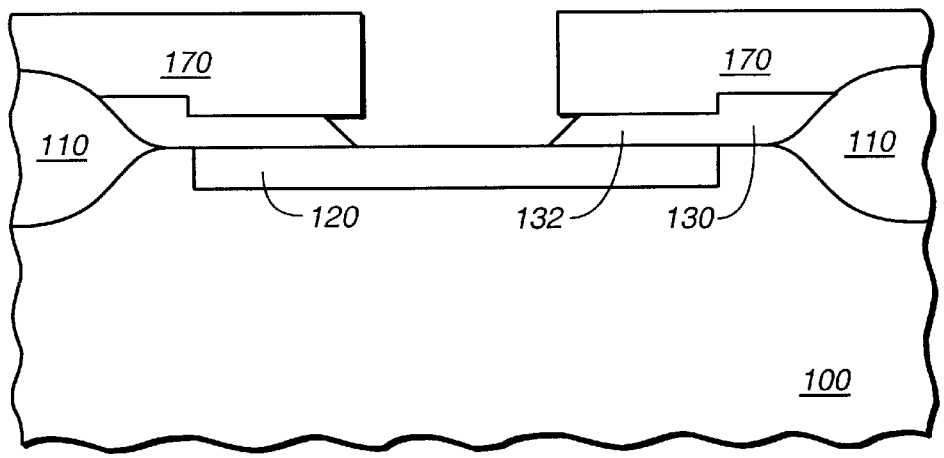
FIG._5
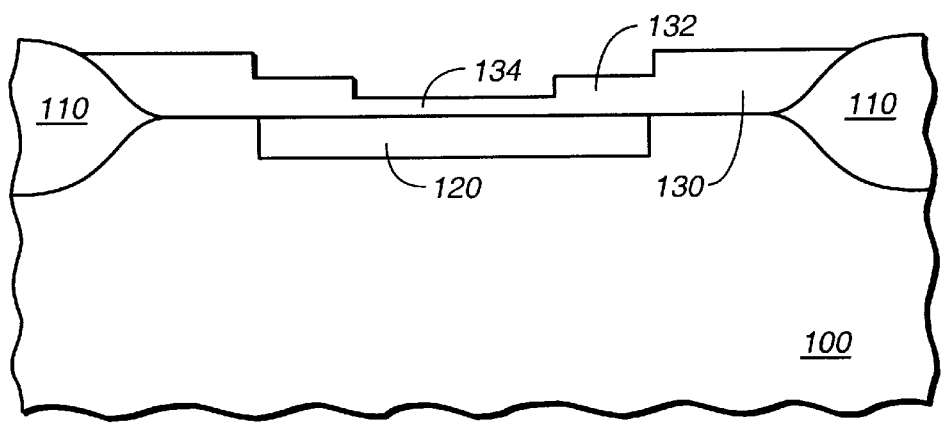
FIG._6

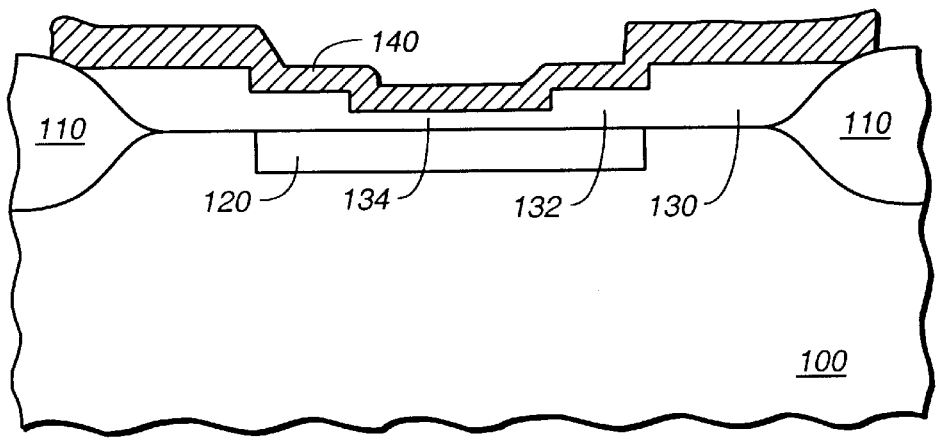

FIG._7

| STEP | GASSES | TEMP | TIME |
|---|---|---|---|
| 1. Push / Stabilize | Low $O_2$ / Ar | 750 deg C | 36 min |
| 2. Ramp / Stabilize | Low $O_2$ / Ar | 820 deg C | 35 min |
| 3. Oxidation | Steam | 820 deg C | 3-12 min |
| 4. Ramp | Ar | 920 deg C | 30 min |
| 5. Anneal | Ar | 920 deg C | 20 min |
| 6. Ramp | Ar | 1000 deg C | 30 min |
| 7. Anneal | $N_2O$ | ..... | ..... |
| 8. Ramp Down | Ar | 750 deg C | 106 min |

FIG._8

| STEP | GASSES | TEMP | TIME |
|---|---|---|---|
| 1. Power Control | $N_2O$ | 550 deg C | 50 sec |
| 2. Ramp Up 1 | $N_2O$ | 750 deg C | 5 sec |
| 3. Stabilization | $N_2O$ | 750 deg C | 10 sec |
| 4. Ramp Up 2 | $N_2O$ | 1050 deg C | 9 sec |
| 5. Anneal | $N_2O$ | 1050 deg C | 40 sec |
| 6. Ramp Down | $N_2O$ | 750 deg C | 12 sec |
| 7. Cool 1 | $N_2$ | | 10 sec |
| 8. Cool 2 | $N_2$ | | 40 sec |
| 9. End | | | 40 sec |

FIG._9

METHOD OF FABRICATING A HIGH QUALITY THIN OXIDE

BACKGROUND OF THE INVENTION

The invention relates to fabrication of semiconductor devices, and more specifically, to methods for fabricating high quality thin oxides for semiconductor devices.

The quality of thin oxides for gate insulating is becoming more important in the field of semiconductor devices fabrication. Many broad categories of commercial devices, such as electrically erasable programmable read only memories (EEPROMs), dynamic random access memories (DRAMs), and more recently, even high-speed basic logic functions, owe their commercialization to the reproducibility of high quality, very thin oxide layers. High quality dielectrics are needed in such devices to achieve satisfactory devices performance both in terms of speed and longevity.

Present gate insulating layers fall short of the requirements necessary for future devices. Most conventional gate insulating layers are pure silicon oxide $SiO_2$ oxide films formed by thermal oxidation. Others employ a combination of a high temperature deposited $SiO_2$ layer on a thermally grown layer. Pure $SiO_2$ layers are unsuitable for future devices because their integrity is inadequate when formed to thicknesses below 150 Å. That is, they suffer from their inherent physical and electrical limitations. Still further, $SiO_2$ layers suffer from their inability to be manufactured uniformly and defect-free when formed thin. Additionally, subsequent VLSI processing steps continue to degrade the already fragile integrity of thin $SiO_2$ layers. In addition, pure $SiO_2$ layers tend to degrade when exposed to charge injection, by interface generation and charge trapping. As such, pure $SiO_2$ layers are simply inadequate as thin films for future scaled technologies.

It is discovered that the presence of nitrogen in the silicon oxide significantly improves the electrical characteristics of tunnel oxides of EEPROM devices as well as gate oxides of MOS transistors. The presence of nitrogen in the oxide layer, typically a silicon dioxide film, significantly improves the breakdown characteristics of the film. The role of the nitrogen in improving the oxides has been postulated to relax the Si—O bonds by forming Si—N bonds or N—O bonds. See H. Fukada et al. IEEE Elect. Dev. Letters, vol. 12, no. 11, 1991 and A. T. Wu et al., Appl. Physics Letters, vol. 55, 1989. The formation of Si—N or N—O bonds enhances the bond strength and reduces the interface trap density of the oxide, therefore, improving breakdown characteristics.

Experiments have shown MOS capacitors with nitrous oxide possess extremely tight time dependent dielectric breakdown ("TDDB") distributions. The improvement in TDDB persists even after complete processing and is observed for various structures such as capacitors on p-substrate, capacitors on n+ implanted regions and surface capacitors.

Additionally, it has been discovered that exposing the gate oxide in nitrous oxide $N_2O$ following the thin gate oxide growth is an effective source of introducing nitrogen to the gate oxide layer under specific temperature conditions. The introduction of nitrogen to the gate oxide layer can significantly enhance the dielectric qualities of the oxide film. The mechanism is believed to work by the nitrogen incorporating itself at the Si/SiO2 interface, replacing the hydrogen that has attached itself to the dangling bonds at that interface. The bond strength of silicon nitride is much higher than that of silicon hydride making for a much more stable film under thermal, electric field or radiation stress.

In tunnel oxides, breakdowns occur because of the trapping of charge in the oxides, thereby gradually raising the electric field across the oxides until the oxides can no longer withstand the induced voltage. Higher quality oxides trap fewer charges over time and will therefore take longer to break down.

It is believed that the improvement in time to breakdown for both tunnel oxides and gate oxides is due to the charge stability in the $Si/SiO_2$ interface, the poly-silicon/SiO2 and throughout the gate oxide and tunnel oxide region afforded by the presence of nitrogen in these regions.

U.S. Pat. No. 5,296,411 issued to Gardner et al. on Mar. 22, 1994 ("Gardner") discloses a rapid thermal processing ("RTP") annealing of the tunnel oxide in a $N_2O$ ambient environment follows the formation of the thin oxide layer produces high quality thin oxides with improved TDDB. It has been observed that simply adding nitrogen as a source gas will not provide the same results. Thus, the Gardner's disclosure uses $N_2O$ as a source gas and to decompose $N_2O$ with a sufficiently high temperature in order for the improvement caused by the presence of nitrogen in the $Si/SiO_2$ interface. Furthermore, it is also noted that the use of only oxygen gas and nitrogen gas mixture will also not produce the required improvement of the gate and/or tunnel oxides.

However, it was found that the Gardner's process of using high temperature alone to breakdown nitrous oxide can cause increased stress on the semiconductor wafer and increase the dopant diffusion. Additionally, even when $N_2O$ is broken down using relatively high temperatures, the amount of NO present is only approximately 5% of the total volume. Therefore, an improved nitrous oxide annealing process is needed for controlling the stress and dopant diffusion on the semiconductor wafer while providing a higher concentration of nitrogen in the annealing process.

Thus, despite the quality improvement shown in oxides due to the conventional use of a $N_2O$ anneal, further improvements are needed to perfect the thin oxide forming process in order to enhance oxide quality and improve the TDDB.

SUMMARY OF THE INVENTION

Therefore, it is an object of the invention to provide a method for more effectively providing a semiconductor device having a high quality thin oxide layer that has improved TDDB characteristics.

A method is disclosed for forming a high quality oxide upon a surface region of a semiconductor body including the steps of: forming a thin oxide layer by oxidizing the silicon wafer in a steam environment; annealing the thin oxide layer in an inert gas ambient; and introducing nitrogen into the oxide under a nitrous oxide $N_2O$ ambient using a combination of annealing procedures.

In the present invention, the thin oxide layer is preferably formed using a steam oxidation procedure. The steam oxidation procedure produces a high quality thin oxide layer in a single step oxidation rather than conventional multi-step dry oxidation process. It is found that by using the steam oxidation procedure, the resulting thin oxide has a superior dielectric oxide film than the dielectric film formed by dry oxidation method. The ratio of the hydrogen to oxygen during the oxidation step is closely controlled. By monitoring the ratio of hydrogen and oxygen gases during the oxidation step, the resulting oxide film thickness and quality can be controlled while an appropriate film for graded nitridation can be provided.

Subsequent to the thin oxide forming step, nitrogen is introduced to the thin oxide by a combination of nitrous oxide annealing procedures. In the preferred embodiment of the present invention, the nitrous oxide annealing is performed under combinations of in-situ (i.e. tube) and RTP annealing in various conditions of temperature and time. The combinations of the nitrous oxide annealing steps have shown improvement in the quality of the resulting tunnel oxide over the single step nitrous oxide RTP annealing both to the negative and position injection TDDB values. Particularly, negative injection refers to electrons leaving the floating gate to substrate whereas positive injection refers to electrons leaving substrate to the floating gate. In addition, the final oxide thickness and quality can be controlled through the use of different temperature settings during each step of the combination nitrous oxide annealing.

In another embodiment of the present invention, prior to the thin oxide forming step, an ion implant is performed on the EEPROM oxides. Arsenic is preferably used in this step of implant because it is found that the use of arsenic implant results in high quality thin oxides.

Advantages of the present invention include higher TDDB values. In addition, in the present invention, the temperature, the type of gas and the flow rate of the gas are variables in controlling the quality of the thin oxide. Therefore, an optimum process may be advantageously performed.

Additional objects, features and advantages of various aspects of the present invention will become apparent from the following description of its preferred embodiments, which description should be taken in conjunction with the accompanying drawings.

BRIEF DESCRIPTION OF THE DRAWINGS

FIGS. 1–7 are cross sectional views illustrating the process steps utilized in forming gate and tunnel oxides in a P-well active region in a CMOS EEPROM process.

FIG. 8 shows a table illustrating a preferred embodiment of the tunnel oxidation sequence including nitrous oxide annealing according to the present invention.

FIG. 9 shows a table illustrating a preferred embodiment of different stages of the RTP nitrous oxide annealing step according to the present invention.

DETAILED DESCRIPTION OF THE PREFERRED EMBODIMENTS

FIGS. 1–7 are cross-sectional views illustrating a preferred sequence of process steps for forming gate and tunnel oxides in a P-well active area of a CMOS EEPROM process according to the present invention. In this example, the gate oxide formed is used to fabricate N-channel MOS transistors, and the tunnel oxide is used to fabricate a structure useful to an EEPROM cell element. However, the following processing steps are not limited to the forming of thin oxide of the EEPROM cell element, the same process steps can be used for the formation of the thin oxide whenever a high quality thin oxide is required.

Improving the dielectric means that one can pass larger amounts of charges through the oxide without changing its dielectric properties. This has applications in EEPROM/memories, programmable logic devices ("PLDs") and other devices. For example, the number of times a memory can be written and erased increases with the amount of charges passed. Thus by increasing the amount of charges, one increases performance by increasing the number of programmable cycles available for a memory.

Referring to FIG. 1, P-well filed oxides 110 are formed using a local oxidation of silicon ("LOCOS") process upon a silicon substrate 100. P-well field oxide 110 defines a P-well active area between P-well field oxide 110. A layer of sacrificial oxide 120 is then grown in a dry oxidation environment to an oxide thickness of approximately of 300 Å.

Under this preferred embodiment, the forming and the subsequent removing of sacrificial oxide prepares the silicon substrate for the formation of the gate dielectric. The sacrificial oxide layer removes contaminants such as dry-etched induced damage and silicon-nitride spots or ribbons formed by the "KOOI effect." However, even with the use of sacrificial oxide layer, contaminations such as silicon nitride spots still cannot be totally removed. Thus, any gate insulator with a thermally grown oxide layer formed would still suffer to some degree from "white ribbon effects." Therefore, in a preferred embodiment according to the present invention, the sacrificial oxide layer is removed with a wet etchant just prior to gate insulator formation. The wet etchant can either be HF or Buffered Oxide Etchant ("BOE"). The substrate is then rinsed and dried so that a high quality gate insulating layer can be formed over the active region of substrate.

Referring to FIG. 2, a layer of approximately 300 Å of EEPROM oxide 130 is grown upon the silicon surface in a dry or steam ambient. As shown in FIG. 3, photoresist 160 is then applied on the surface to define regions to receive tunnel oxide doping through the EEPROM oxide 130.

Referring to FIG. 3, an ion implant 170 is applied on the surface through the exposed EEPROM oxide and into the substrate in the P-well active area 100. Although other implant elements such as phosphorus can be used in this ion implantation process, Arsenic is preferred because it is found that the resulting thin oxide exhibits a higher quality and TDDB values. The photoresist layer 160 is then removed and the surface is prepared for tunnel window definition by an RCA clean operation, resulting in the structure shown in FIG. 4. The RCA cleaning procedure was formulated by Kern and Puotinen at RCA and is well known in the art.

A second photoresist layer 170 is then applied to define the region in which the tunnel oxide is to be grown. The resulting structure is shown in FIG. 5.

In the preferred embodiment of the present invention, a layer of tunnel or gate oxide is grown using a steam oxidizing ambient comprising a mixture of the hydrogen $H_2$ and oxygen $O_2$ gases. The ratio of hydrogen to oxygen gases is adjusted from 1–1.8 to 1 in order to enhance monitoring of the thickness while providing an appropriate film for graded nitridation. Steps 1–3 of FIG. 8 shows the preferable environment of the temperature and time for this step of thin oxide forming. It should be noted that the conditions can be adjusted to accommodate a wide variety of fabrication needs for the thin oxide. According to the present invention, the initial physical oxide is defined in the temperature range of 820 deg Celsius to 840 deg Celsius for a time of 3 to 12 minutes (Step 3 of FIG. 8).

Referring to FIG. 6, the second photoresist layer 170 pattern is translated into the EEPROM oxide 132 layer using Buffered Oxide Etchant ("BOE"). In the preferred embodiment as shown, the second photoresist layer removal is completed as part of the same process. In addition, the EEPROM oxide 132 damaged by the arsenic implant 170 is etched by a RCA cleaning step. The undamaged oxide 130 is not substantially etched. The subsequent tunnel oxide operation drives the arsenic implant layer 120 into the substrate 100, whereby lowering the surface concentration of the arsenic. In addition, the subsequent thin oxide forming operation activates the arsenic implant that forms an N-layer in the P-well.

Subsequent to the steam oxidization step, the thin oxide is annealed in an inert atmosphere (e.g. Ar or $N_2$). Preferably, argon gas is used for this step of annealing because the argon gas provides a more stable environment for producing high quality thin oxide than annealing under other inert gases. However, this process is not limited to argon annealing.

After the inert gas annealing, the thin oxide is annealed again under nitrous oxide ambient(s) for nitridation of the oxide layer.

In the preferred embodiment of the present invention, a combination of in-situ annealing and rapid thermal processing ("RTP") annealing in nitrous oxide $N_2O$ ambient is used. It is found that negative and positive injection TDDB can be effected in similar or opposite directions using various combinations of the in-situ and RTP conditions of temperature and time. Negative injection refers to electrons leaving the floating gate to substrate whereas positive injection refers to electrons leaving substrate to the floating gate. Particularly, the NO is required to achieve such high quality oxides. However, in the present invention, the use of nitrous oxide $N_2O$ alone in the combination of in-situ and RTP annealing following the abovementioned steps produces comparable, or even higher, quality thin oxide.

Generally, in-situ annealing is performed in the same reaction chamber of the thermal oxidation. In the preferred embodiment of the present invention, the reaction chamber is filled with nitrous oxide $N_2O$, in concentration ranges from 5–10%. The in-situ annealing process is usually divided into two steps: annealing, followed by a ramp-down in temperature. During the annealing, temperature is maintained to about 800–1000 degree Celsius for 30–60 minutes. And the ramp down time is about 30 to 60 minutes. In the preferred embodiment as shown, the thermal oxidation chamber is filled essentially with nitrous oxide $N_2O$.

On the other hand, the RTP annealing is performed under short time, and high temperature in a controlled environment. Specifically, in the preferred embodiment of the present invention, the RTP annealing is performed inside a RTP chamber. In the RTP annealing process, wafers are subjected to high temperatures only long enough to achieve the desired process effect, and dopant diffusion is minimized. Thus, short-time thermal processes must be performed in specially designed systems. In conventional furnaces or reactors, the large thermal mass of the susceptors, wafer boats, and reactor walls, rules them out as possible systems for performing short thermal cycles. In additional, if large diameter wafers are heated or cooled too rapidly in a furnace, wafer warpage or skip can result.

In addition, large-area incoherent energy sources were also developed to overcome these limitations. These sources emit radiant light, which then heats the wafers. This allow very rapid and uniform heating and cooling. Systems are available in which such RTP is performed. Wafers in RTP systems are thermally isolated, so that radiant (not conductive) heating and cooling is dominant. Temperature uniformity is an important design consideration in these systems so that thermal gradients, which can cause slip or warpage, are minimized. The heating chamber provides a controlled environment of the wafer, and for coupling energy from the radiant energy sources to the wafers. Particularly, precise control of time and temperature is necessary to obtain reproducible RTP results.

In the preferred embodiment of the present invention, the thin oxide is annealed again under essentially nitrous oxide $N_2O$ by a RTP annealing process after the in-situ annealing. Single wafer RTP annealing to temperature higher than 1000 degree Celsius disclosed herein is used so that less undue diffusion is incurred. The RTP annealing step is preferably done under 1050 to 1150 degree Celsius for 30 to 90 seconds (Step 5 of FIG. 9). It was found that the combination of the nitrous oxide annealing steps forms approximately another 20 to 25 Å of oxide, whereas only 2 to 5 Å of oxide is formed under a single RTP nitrous oxide annealing step. In the preferred processed as described, the final thickness of the thin oxide ranges from 60 to 110 Å depending on the furnace and RTP settings.

It should be noted that the combination nitrous oxide annealing method of the present invention is also particularly advantageous to gate oxides grown in the abovementioned steam oxidation environment.

One of the factors of achieving high quality oxide is to control the nitrogen profile within the thin oxide layer. It is found that in-situ (tube) nitrous oxide and RTP nitrous oxide annealing taken separately have opposite effect on the negative and positive injection TDDB values. Therefore, it is preferably to employ a combination of both in-situ nitrous oxide annealing and the RTP nitrous oxide annealing. By combining both the in-situ (tube) nitrous oxide annealing and the RTP nitrous oxide annealing, a high quality thin oxide can be formed with a controlled thickness.

In addition, in one embodiment of the present invention, the use of a chlorine source is eliminated in the furnace tube because the tube is periodically cleaned with a trans-LC recipe.

As shown in FIG. 7, an amorphous silicon layer is then deposited subsequent to the nitrous oxide annealing step. The amorphous silicon layer is then doped with phosphorous and defined to form the floating gate structure of the EEPROM device. In particular, amorphous silicon 140 is deposited above tunnel oxide 134 to form a structure useful to an EEPROM cell which conducts current through tunnel oxide 134 if the electric field across the tunnel oxide 134 is high enough.

Interpoly dielectric layers are subsequently created and then selectively removed from non-EEPROM areas using a combination of dry and wet etching. The tunnel oxide quality can be measured directly after the wet etch which exposes the contact region permitting N-substrate contact required for charge to breakdown ("QBD") testing.

FIG. 8 shows a table illustrating a preferred embodiment of the tunnel oxidation sequence according to the present invention. The tunnel oxidation proceeds as a two-stage oxidation cycle, with the nitrous oxide $N_2O$ annealing steps performed after the post oxidation argon anneal. As discussed in detail in the previous paragraphs, the nitrous oxide annealing step (Step 7) of the preferred embodiment of the present invention comprises two separate steps performed in-situ and RTP.

FIG. 9 shows a table illustrating a preferred embodiment of different stages of the RTP nitrous oxide annealing step. The table shows the gases, temperatures and time requirements of a preferred embodiment of the RTP nitrous oxide annealing step. As previously discussed, these parameters can be adjusted in order to achieve different thickness of the resulting thin oxide.

It is to be understood that while the invention has been described above in conjunction with preferred specific embodiments, the description and examples are intended to illustrate and not limit the scope of the invention, which is defined by the scope of the appended claims.

What is claimed is:

1. A method for forming a high quality oxide on a semiconductor body, comprising the steps of:

forming a sacrificial oxide layer on said semiconductor body by oxidizing said semiconductor body;

doping at said sacrificial layer with arsenic through said sacrificial oxide and into said semiconductor body;

etching said sacrificial oxide to expose said semiconductor body;

forming a thin oxide layer on said semiconductor body by oxidizing said semiconductor body under a steam ambient, wherein said steam ambient comprises a mixture of hydrogen gas and oxygen gas;

annealing said thin oxide layer under an argon ambient;

annealing said thin oxide layer in-situ by supply a gas comprising nitrous oxide; and annealing said thin oxide layer using a rapid thermal processing under a nitrous oxide ambient, wherein said high quality oxide is formed.

2. The method as recited in claim 1, wherein said nitrous oxide in-situ annealing step is performed at temperature ranging from 800 degree Celsius to 1000 degree Celsius.

3. The method as recited in claim 2, wherein said nitrous oxide in-situ annealing step is performed for between 30 to 60 minutes.

4. The method as recited by claim 1, wherein said rapid thermal processing annealing step is preformed at temperature ranging from 1050 degree Celsius to 1150 degree Celsius.

5. The method as recited by claim 4, wherein said rapid thermal processing annealing step is performed for between about 40 to 90 seconds.

6. A method for forming a high quality oxide on a semiconductor body, comprising the steps of:

forming a thin oxide layer on said semiconductor body by oxidizing said semiconductor body under a steam ambient;

annealing said thin oxide layer under an inert gas ambient;

annealing said thin oxide layer in-situ under a first nitrous oxide ambient, and annealing said thin oxide layer using a rapid thermal processing under a second nitrous oxide ambient, wherein said high quality oxide is formed.

7. The method as recited in claim 6, wherein said inert gas ambient comprises an argon gas.

8. The method as recited in claim 6, wherein said first nitrous oxide ambient comprises at least 5% nitrous oxide.

9. The method as recited in claim 8, wherein said nitrous oxide in-situ annealing step is performed at temperature ranging from 800 degree Celsius to 1000 degree Celsius.

10. The method as recited in claim 9, wherein said nitrous oxide in-situ annealing step is performed for between 30 to 60 minutes.

11. The method as recited in claim 6, wherein said second nitrous oxide ambient in said rapid thermal processing nitrous oxide annealing step comprises essentially of nitrous oxide.

12. The method as recited in claim 11, wherein said rapid thermal processing annealing step is performed at temperature ranging from 1050 degree Celsius to 1150 degree Celsius.

13. The method as recited in claim 11, wherein said rapid thermal processing annealing step is performed for between about 40 to 90 seconds.

14. The method as recited in claim 6, wherein said steam ambient in said thin oxide forming step comprises:

a mixture of hydrogen gas and oxygen gas.

15. The method as recited in claim 14, wherein said mixture of hydrogen gas and oxygen gas having a hydrogen to oxygen ratio of approximately 1.8 to 1 by volume.

16. The method as recited in claim 14, wherein said mixture of hydrogen and oxygen gases having a hydrogen to oxygen ratio of approximately 1 to 1 by volume.

17. The method as recited in claim 14, wherein said mixture of hydrogen and oxygen gases having a hydrogen to oxygen ratio of approximately in a range of 1.0–1.8 to 1 by volume.

18. The method as recited in claim 6, further comprising, prior to said thin oxide forming step, the steps of:

forming a sacrificial oxide layer upon said semiconductor body by oxidizing said semiconductor body;

doping through said sacrificial oxide layer into said semiconductor body; and etching said sacrificial oxide to expose said semiconductor body.

19. The method as recited in claim 18, wherein said sacrificial oxide layer and said semiconductor body are doped with arsenic.

20. The method as recited in claim 11, wherein said steam ambient in said thin oxide forming step comprises:

a mixture of hydrogen gas and oxygen gas.

21. The method as recited in claim 20, wherein said mixture of hydrogen and oxygen gases having a hydrogen to oxygen ratio of between about 1.0–1.8 to 1 by volume.

22. The method as recited in claim 18, wherein said first nitrous ambient comprises at least 5% of nitrous oxide.

23. The method as recited in claim 18, wherein said second nitrous ambient comprises essentially of nitrous oxide.

24. The method as recited in claim 23, wherein said steam ambient in said thin oxide layer forming step comprises:

a mixture of hydrogen gas and oxygen gas.

25. The method as recited in claim 24, wherein said mixture of hydrogen and oxygen gases having a hydrogen and oxygen ratio of between about 1.0–1.8 to 1 by volume.

26. The method as recited in claim 6, wherein said high quality oxide serves as a tunnel oxide of an MOS transistor.

27. The method as recited in claim 6, wherein said high quality oxide serves as a tunnel oxide of an EEPROM cell.

28. The method as recited in claim 6, wherein said high quality oxide serves as a tunnel oxide of a flash memory.

* * * * *